(12) United States Patent
Yao

(10) Patent No.: US 8,772,817 B2
(45) Date of Patent: Jul. 8, 2014

(54) ELECTRONIC DEVICE SUBMOUNTS INCLUDING SUBSTRATES WITH THERMALLY CONDUCTIVE VIAS

(75) Inventor: Zhimin Jamie Yao, Santa Barbara, CA (US)

(73) Assignee: Cree, Inc., Durham, NC (US)

( * ) Notice: Subject to any disclaimer, the term of this patent is extended or adjusted under 35 U.S.C. 154(b) by 93 days.

(21) Appl. No.: 12/976,664

(22) Filed: Dec. 22, 2010

(65) Prior Publication Data

US 2012/0161190 A1      Jun. 28, 2012

(51) Int. Cl.
*H01L 33/56* (2010.01)

(52) U.S. Cl.
USPC .............................. 257/99; 257/774; 257/676

(58) Field of Classification Search
USPC .............................. 257/99, 675, 774, E33.056
See application file for complete search history.

(56) References Cited

U.S. PATENT DOCUMENTS

| | | | |
|---|---|---|---|
| 3,948,706 A | 4/1976 | Schmeckenbecher | |
| 4,042,552 A | 8/1977 | Grucza | |
| 4,107,238 A | 8/1978 | Roper et al. | |
| 4,141,941 A | 2/1979 | Travnicek | |
| 4,302,625 A | 11/1981 | Hetherington et al. | |
| 4,539,058 A | 9/1985 | Burgess et al. | |
| 4,562,018 A | 12/1985 | Neefe | |
| 4,650,922 A | 3/1987 | McPherson | |
| 4,794,048 A | 12/1988 | Oboodi et al. | |
| 4,826,424 A | 5/1989 | Arai et al. | |
| 4,918,497 A | 4/1990 | Edmond | |
| 4,935,665 A | 6/1990 | Murata | |
| 4,966,862 A | 10/1990 | Edmond | |
| 5,024,966 A | 6/1991 | Dietrich et al. | |
| 5,027,168 A | 6/1991 | Edmond | |
| 5,087,949 A | 2/1992 | Haitz | |
| 5,110,278 A | 5/1992 | Tait et al. | |
| 5,113,315 A | 5/1992 | Capp et al. | |
| 5,143,660 A | 9/1992 | Hamilton et al. | |

(Continued)

FOREIGN PATENT DOCUMENTS

EP      0 439 227 A1      7/1991
JP      5-152609 A      6/1993

(Continued)

OTHER PUBLICATIONS

Aavid Thermalloy, LLC, *Extrusion Profiles*, retrieved Oct. 18, 2004 from http://www.aavidthermalloy.com/products/extrusion/index.shtml.

(Continued)

*Primary Examiner* — Tran Tran
(74) *Attorney, Agent, or Firm* — Myers Bigel Sibley & Sajovec, P.A.

(57) ABSTRACT

A submount for an electronic device includes a substrate formed of a bulk material including first and second major surfaces on opposite sides of the substrate, a surface insulating layer on the first major surface of the substrate, and a die attach pad on the surface insulating layer. The die attach pad may be electrically insulated from the substrate by the surface insulating layer. The submount further includes a heatsink contact pad on the second major surface of the substrate, and a thermal conduction member extending from the second major surface of the conductive semiconductor substrate through the substrate toward the first major surface of the substrate. The thermal conduction member has a higher thermal conductivity than a thermal conductivity of the bulk material of the substrate.

24 Claims, 5 Drawing Sheets

(56) References Cited

U.S. PATENT DOCUMENTS

| | | |
|---|---|---|
| 5,210,051 A | 5/1993 | Carter, Jr. |
| 5,277,840 A | 1/1994 | Osaka et al. |
| 5,298,768 A | 3/1994 | Okazaki et al. |
| 5,338,944 A | 8/1994 | Edmond et al. |
| 5,374,668 A | 12/1994 | Kanemura et al. |
| 5,393,993 A | 2/1995 | Edmond et al. |
| 5,416,342 A | 5/1995 | Edmond et al. |
| 5,523,589 A | 6/1996 | Edmond et al. |
| 5,604,135 A | 2/1997 | Edmond et al. |
| 5,631,190 A | 5/1997 | Negley |
| 5,739,554 A | 4/1998 | Edmond et al. |
| 5,753,730 A | 5/1998 | Nagata et al. |
| 5,813,753 A | 9/1998 | Vriens et al. |
| 5,851,063 A | 12/1998 | Doughty et al. |
| 5,858,278 A | 1/1999 | Itoh et al. |
| 5,882,553 A | 3/1999 | Prophet et al. |
| 5,912,477 A | 6/1999 | Negley |
| 5,923,084 A | 7/1999 | Inoue et al. |
| 5,959,316 A | 9/1999 | Lowery |
| 5,968,422 A | 10/1999 | Kennedy |
| 6,060,729 A | 5/2000 | Suzuki et al. |
| 6,066,861 A | 5/2000 | Höhn et al. |
| 6,069,440 A | 5/2000 | Shimizu et al. |
| 6,115,255 A | 9/2000 | Iovdalsky |
| 6,120,600 A | 9/2000 | Edmond et al. |
| 6,156,242 A | 12/2000 | Saito et al. |
| 6,177,688 B1 | 1/2001 | Linthicum et al. |
| 6,184,544 B1 | 2/2001 | Toda et al. |
| 6,187,606 B1 | 2/2001 | Edmond et al. |
| 6,201,262 B1 | 3/2001 | Edmond et al. |
| 6,219,223 B1 | 4/2001 | Kobayashi et al. |
| 6,252,254 B1 | 6/2001 | Soules et al. |
| 6,265,767 B1 | 7/2001 | Gaku et al. |
| 6,329,676 B1 | 12/2001 | Takayama et al. |
| 6,373,188 B1 | 4/2002 | Johnson et al. |
| 6,383,417 B1 | 5/2002 | Paulson et al. |
| 6,391,231 B1 | 5/2002 | Evans et al. |
| 6,404,125 B1 | 6/2002 | Garbuzov et al. |
| 6,480,389 B1 | 11/2002 | Shie et al. |
| 6,498,355 B1 | 12/2002 | Harrah et al. |
| 6,531,328 B1 | 3/2003 | Chen |
| 6,562,643 B2 | 5/2003 | Chen |
| 6,599,768 B1 | 7/2003 | Chen |
| 6,639,356 B2 | 10/2003 | Chin |
| 6,686,609 B1 | 2/2004 | Sung |
| 6,707,069 B2 | 3/2004 | Song et al. |
| 6,744,077 B2 | 6/2004 | Trottier |
| 6,783,362 B2 | 8/2004 | Cao |
| 6,791,151 B2 | 9/2004 | Lin et al. |
| 6,824,294 B2 | 11/2004 | Cao |
| 6,853,010 B2 | 2/2005 | Slater, Jr. et al. |
| 7,029,935 B2 | 4/2006 | Negley et al. |
| 7,118,262 B2 | 10/2006 | Negley |
| 7,217,583 B2 | 5/2007 | Negley et al. |
| 7,264,378 B2 | 9/2007 | Loh |
| 7,279,346 B2 | 10/2007 | Andrews et al. |
| 7,322,732 B2 | 1/2008 | Negley et al. |
| 7,326,583 B2 | 2/2008 | Andrews et al. |
| 7,372,198 B2 | 5/2008 | Negley |
| 7,518,158 B2 | 4/2009 | Keller et al. |
| 2002/0123164 A1 | 9/2002 | Slater, Jr. et al. |
| 2003/0006418 A1 | 1/2003 | Emerson et al. |
| 2003/0032212 A1 | 2/2003 | Wang et al. |
| 2003/0067264 A1 | 4/2003 | Takekuma |
| 2003/0080341 A1 | 5/2003 | Sakano et al. |
| 2003/0098459 A1 | 5/2003 | Horiuchi et al. |
| 2003/0153861 A1 | 8/2003 | Royer |
| 2003/0173575 A1 | 9/2003 | Eisert et al. |
| 2003/0214049 A1 | 11/2003 | Hortzleza et al. |
| 2004/0041222 A1 | 3/2004 | Loh |
| 2004/0041757 A1 | 3/2004 | Yang et al. |
| 2004/0056260 A1 | 3/2004 | Slater, Jr. et al. |
| 2004/0079957 A1 | 4/2004 | Andrews et al. |
| 2004/0095738 A1 | 5/2004 | Juang |
| 2004/0126913 A1 | 7/2004 | Loh |
| 2004/0211970 A1 | 10/2004 | Hayashimoto et al. |
| 2004/0222433 A1 | 11/2004 | Mazzochette et al. |
| 2005/0146854 A1 | 7/2005 | Ikuta et al. |
| 2005/0269587 A1 | 12/2005 | Loh et al. |
| 2006/0097382 A1 | 5/2006 | Mori et al. |
| 2006/0097385 A1 | 5/2006 | Negley |
| 2006/0124953 A1 | 6/2006 | Negley et al. |
| 2006/0226124 A1 | 10/2006 | Nakamura et al. |
| 2006/0234420 A1 | 10/2006 | Yokozuka et al. |
| 2007/0145473 A1 | 6/2007 | Asano et al. |
| 2007/0253209 A1 | 11/2007 | Loh et al. |
| 2008/0186682 A1 | 8/2008 | Sugimura |
| 2009/0085180 A1 | 4/2009 | Kan et al. |
| 2009/0111169 A1 | 4/2009 | Kim et al. |
| 2009/0154513 A1 | 6/2009 | Shin |
| 2009/0273002 A1 | 11/2009 | Chiou et al. |
| 2011/0316147 A1* | 12/2011 | Shih et al. .............. 257/737 |
| 2012/0007132 A1* | 1/2012 | Chang et al. ............ 257/99 |

FOREIGN PATENT DOCUMENTS

| | | |
|---|---|---|
| JP | 6-151974 A | 5/1994 |
| JP | 6-177429 A | 6/1994 |
| JP | 6-244458 A | 9/1994 |
| JP | 08-116095 A | 5/1996 |
| JP | 8-162676 A | 6/1996 |
| JP | 09-083018 A | 3/1997 |
| JP | 9-246603 A | 9/1997 |
| JP | 10-098215 A | 4/1998 |
| JP | 10-242513 A | 9/1998 |
| JP | 11-261114 A | 9/1999 |
| JP | 11-298047 A | 10/1999 |
| JP | 2000-101147 A | 4/2000 |
| JP | 2000-174347 A | 6/2000 |
| JP | 2000-183405 A | 6/2000 |
| JP | 2000-286455 A | 10/2000 |
| JP | 2000-286458 A | 10/2000 |
| JP | 2001-77427 A | 3/2001 |
| JP | 2001-77433 A | 3/2001 |
| JP | 2001-144334 A | 5/2001 |
| JP | 2001-230453 A | 8/2001 |
| JP | 2002-118293 A | 4/2002 |
| JP | 2002-158378 A | 5/2002 |
| JP | 2002-223004 A | 8/2002 |
| JP | 2002-280616 A | 9/2002 |
| JP | 2003-17755 A | 1/2003 |
| JP | 2003-318448 A | 11/2003 |
| JP | 2009/206216 A | 9/2009 |
| WO | WO 97/24706 A2 | 7/1997 |
| WO | WO 97/24706 A3 | 7/1997 |
| WO | WO 01/61764 A1 | 8/2001 |
| WO | WO 02/059982 A1 | 8/2002 |

OTHER PUBLICATIONS

Cabot Corporation, *Using Nanogel in Daylighting Systems*, retrieved Jan. 11, 2005 from http://w1.cabot-corp.com/Controller.jsp?....

Craford, *Overview of Device Issues in High-Brightness Light-Emitting Diodes*, Chapter, *High Brightness Light Emitting Diodes: Semiconductors and Semimetals*, vol. 48, Stringfellow et al. ed., Academic Press, 1997, pp. 47-63.

Cree, Inc., *Cree Optoelectronics LED Product Line*, Publication CPR3AX, Rev. D, 2001-2002.

Heatron, *ELPOR® Product Information*, retrieved Oct. 6, 2004 from http://www.heatron.com.

Heatron, *Metal Core PCBs for LED Light Engines* (Product Brochure), retrieved from http://www.heatron.com.

International Search Report and Written Opinion of the International Searching Authority for International Application No. PCT/US2010/045713; Date of Mailing: May 13, 2011; 14 pp.

International Search Report, PCT/US03/27912, Jan. 30, 2004.

IRC Advanced Film Division, *Insulated Aluminum Substrates* (Product Brochure) retrieved from http://www.irctt.com, copyright 2002.

IRC Advanced Film Division, *Thick Film Application Specific Capabilities* (Product Brochure), retrieved from http://www.irctt.com, copyright 2002.

(56) References Cited

OTHER PUBLICATIONS

Morris, *IRC's Anotherm™ PC Boards Eliminate Heat for Automotive LED Applications*, Mar. 16, 2004 Press Release, retrieved Sep. 17, 2004 from http://www.irctt.com/pages/Anotherm_PressRelease.cfm.

Notification of Transmittal of the International Search Report and the Written Opinion of the International Searching Authority, or the Declaration, "Written Opinion of the International Searching Authority" and "International Search Report", PCT/2004/017326, Jul. 14, 2005.

Notification of Transmittal of the International Search Report and the Written Opinion of the International Searching Authority, or the Declaration, International Search Report and Written Opinion of the International Searching Authority, PCT/US2004/017325, Sep. 28, 2004.

International Search Report Corresponding to International Application No. PCT/US2011/065807; Date of Mailing: May 4, 2012; 11 Pages.

International Preliminary Report on Patentability Corresponding to International Application No. PCT/US2011/065807; Date of Mailing: Jul. 4, 2013; 9 Pages.

\* cited by examiner

ELECTRONIC DEVICE SUBMOUNTS INCLUDING SUBSTRATES WITH THERMALLY CONDUCTIVE VIAS

BACKGROUND

The present invention relates to the packaging of semiconductor devices, and more particularly to submounts for use in packaging semiconductor devices, such as light emitting diodes.

Light emitting diodes (LEDs) are often packaged within leadframe packages. A leadframe package typically includes a molded plastic body which encapsulates an LED, a lens portion, and thin metal leads connected to the LED and extending outside the plastic body. The metal leads of the leadframe package serve as the conduit to supply the LED with electrical power and, at the same time, may act to draw heat away from the LED. Heat is generated by the LED when power is applied to the LED to produce light. A portion of the leads extends out from the package body for connection to circuits external to the leadframe package.

Some of the heat generated by the LED is dissipated by the plastic package body; however, most of the heat is drawn away from the LED via the metal components of the package. The metal leads are typically very thin and have a small cross section. For this reason, capacity of the metal leads to remove heat from the LED is limited. This limits the amount of power that can be applied to the LED thereby limiting the amount of light that can be generated by the LED.

To increase the capacity of an LED package to dissipate heat, in one LED package design, a heat sink slug is placed under the metal leads within the LED package. The heat sink slug increases the capacity of the LED package to dissipate heat; however, the heat sink slug increases the size, the mass, and the cost of the LED package. Increases in the size, the mass, and the cost are undesirable.

In another LED package design, the leads of the leadframe are extended (in various shapes and configurations) beyond the immediate edge of the LED package body. This increases the surface area of the portions of the leads exposed to the surrounding air. The increased exposed surface area of the extended leads increases the capacity of the LED package to dissipate heat; however, the extended leads increase the size, the mass, and the cost of the LED package.

Another undesirable aspect of the leadframe package design relates to problems associated with thermal expansion of the package. When heat is generated, the LED package experiences thermal expansion. Each of the parts of the LED package has a different coefficient of thermal expansion (CTE). For example, the CTE of the LED, the CTE of the package body, the CTE of the leads, and the CTE of lens are different from each other. For this reason, when heated, each of these parts experience different degrees of thermal expansion resulting in mechanical stresses between the parts of the package thereby adversely affecting its reliability.

To avoid some of the problems associated with leadframe based packages, solid state electronic devices can be mounted on submounts that provide mechanical support, electrical connection, and thermal dissipation, as well as other functionality, for the electronic devices. For example, solid state light sources, such as semiconductor light emitting diodes, can be mounted on submounts as disclosed in U.S. Pre-grant Publication No. 2007/0253209 which is assigned to the assignee of the present invention and which is incorporated herein by reference as if fully set forth herein. The submounts may further be provided in packages that provide protection, color selection, focusing and the like for light emitted by the light emitting device. A solid state light emitting device may be, for example, an organic or inorganic light emitting diode ("LED"). Some packages for light emitting diodes are described in U.S. Pre-grant Publication Nos. 2004/0079957, 2004/0126913, and 2005/0269587 which are assigned to the assignee of the present invention, and which are incorporated herein by reference as if set forth fully herein.

A ceramic-based submount is illustrated in FIG. 1. As shown therein, a submount 5 for mounting an electronic device can be formed by punching or drilling via holes 12 in a substrate of green state alumina 10. As used herein, "substrate" refers to a layer of material that provides mechanical support for an object, such as an electronic device. A submount includes a substrate and therefore provides mechanical support for an electronic device as well, but a submount may also include features that provide electrical connections such as die attach pads, electrical traces, etc., features that dissipate thermal energy, features that provide optical functionality, such as reflectors and/or lenses, and/or other functionality. The via holes 12 can be plated and/or filled with conductive material 14, such as copper or aluminum, and the green state alumina tape 10 and the vias 12, 14 can be co-fired to transform the green state alumina tape 10 into an alumina substrate 10. Contact pads 16, 18, that electrically connect to the vias 12, 14, can be formed on opposite sides of the alumina substrate 10, for example by plating and patterning metal traces. In this manner, electrically and thermally conductive paths can be formed from one side of the substrate to the other.

SUMMARY

Some embodiments provide a submount for an electronic device. The submount includes a substrate including first and second major surfaces on opposite sides of the substrate, a surface insulating layer on the first major surface of the semiconductor substrate, and a die attach pad on the surface insulating layer. The die attach pad may be electrically insulated from the semiconductor substrate by the surface insulating layer. The submount further includes a heatsink pad on the second major surface of the substrate, and a thermal conduction member extending from the second major surface of the substrate through the substrate toward the first major surface of the substrate. The thermal conduction member may be between the die attach pad and the heatsink pad, and the thermal conduction member may have a higher thermal conductivity than a thermal conductivity of the substrate.

The submount may further include an electrically insulating sidewall spacer between the thermal conduction member and the substrate. The thermal conduction member may be insulated from the substrate by the electrically insulating sidewall spacer.

The thermal conduction member may be in direct contact with the surface insulating layer and may be insulated from the die attach pad by the surface insulating layer.

The thermal conduction member may be in direct contact with the heatsink pad.

The submount may further include a second surface insulating layer on the second major surface of the substrate. The second surface insulating layer may be between the heatsink pad and the substrate. The thermal conduction member may extend through the second surface insulating layer to contact the heatsink pad.

The thermal conduction member may be electrically isolated from the heatsink pad by the second surface insulating layer.

The submount may further include a plurality of thermal conduction members extending from the second major surface of the substrate toward the first major surface of the substrate.

The submount may further include a second surface insulating layer on the second major surface of the substrate, and the second surface insulating layer may be between the heatsink pad and the substrate.

The plurality of thermal conduction members may extend through the second surface insulating layer to contact the heatsink pad.

The plurality of thermal conduction members may be electrically isolated from the heatsink pad by the second surface insulating layer.

The plurality of thermal conduction members may include planar surfaces that are parallel to corresponding planar surfaces of adjacent ones of the thermal conduction members.

The submount may further include a second surface insulating layer on the second major surface of the substrate, and a contact pad on the second major surface of the substrate. The contact pad may be electrically isolated from the substrate by the second surface insulating layer. The submount may further include a thermal conduction member extending through the substrate, the first surface insulating layer and the second surface insulating layer. The thermal conduction member may electrically connect the die attach pad and the contact pad in some embodiments.

The thermal conduction member may be insulated from the substrate by an electrically insulating sidewall spacer.

The submount may further include a bonding pad on the first major surface of the substrate. The bonding pad may be electrically insulated from the substrate by the first surface insulating layer. The submount may further include a second contact pad on the second major surface of the substrate. The second contact pad may be electrically isolated from the substrate by the second surface insulating layer. A second thermal conduction member may extend through the substrate, the first surface insulating layer and the second surface insulating layer. The second thermal conduction member may electrically connect the bonding pad and the second contact pad.

The thermal conduction member may be insulated from the substrate by a first electrically insulating sidewall spacer and the second electrically conductive thermal conduction member may be insulated from the substrate by a second electrically insulating sidewall spacer.

Some embodiments provide methods of forming a submount for an electronic device. The methods may include providing a substrate including first and second major surfaces on opposite sides of the substrate, forming a surface insulating layer on the first major surface of the semiconductor substrate, forming a die attach pad on the surface insulating layer, wherein the die attach pad is electrically insulated from the semiconductor substrate by the surface insulating layer, forming a heatsink pad on the second major surface of the substrate, and forming a thermal conduction member extending from the second major surface of the substrate through the substrate toward the first major surface of the substrate. The thermal conduction member may be between the die attach pad and the heatsink pad, and the thermal conduction member may have a higher thermal conductivity than a thermal conductivity of the substrate.

The methods may further include forming an electrically insulating sidewall spacer between the thermal conduction member and the substrate, wherein the thermal conduction member may be insulated from the substrate by the electrically insulating sidewall spacer.

The thermal conduction member may be in direct contact with the surface insulating layer and may be insulated from the die attach pad by the surface insulating layer.

The thermal conduction member may be in direct contact with the heatsink pad.

The methods may further include forming a second surface insulating layer on the second major surface of the substrate. The second surface insulating layer may be between the heatsink pad and the substrate.

The thermal conduction member may extend through the second surface insulating layer to contact the heatsink pad.

The thermal conduction member may be electrically isolated from the heatsink pad by the second surface insulating layer.

The methods may further include forming a plurality of thermal conduction members extending from the second major surface of the substrate toward the first major surface of the substrate.

The methods may further include forming a second surface insulating layer on the second major surface of the substrate. The second surface insulating layer may be between the heatsink pad and the substrate.

Methods of forming submount for an electronic device according to further embodiments include providing a substrate including first and second major surfaces on opposite sides of the substrate, forming a via hole through the substrate from the first major surface to the second major surface of the substrate, forming an electrically insulating sidewall spacer in the via hole, and forming a thermal conduction member within the via hole. The thermal conduction member may have a higher thermal conductivity than a thermal conductivity of the substrate, and the thermal conduction member may be insulated from the substrate by the electrically insulating sidewall spacer. The methods may further include forming a surface insulating layer on the first major surface of the substrate to cover the thermal conduction member.

A light emitting device according to some embodiments includes a submount and a solid state light emitting device on the submount. The submount includes a substrate including first and second major surfaces on opposite sides of the substrate, a surface insulating layer on the first major surface of the semiconductor substrate, and a die attach pad on the surface insulating layer. The die attach pad may be electrically insulated from the semiconductor substrate by the surface insulating layer. The submount further includes a heatsink pad on the second major surface of the substrate, and a thermal conduction member extending from the second major surface of the substrate through the substrate toward the first major surface of the substrate. The thermal conduction member may be between the die attach pad and the heatsink pad, and the thermal conduction member may have a higher thermal conductivity than a thermal conductivity of the substrate. The solid state light emitting device is mounted on the die attach pad.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION OF EMBODIMENTS

Figure 1:
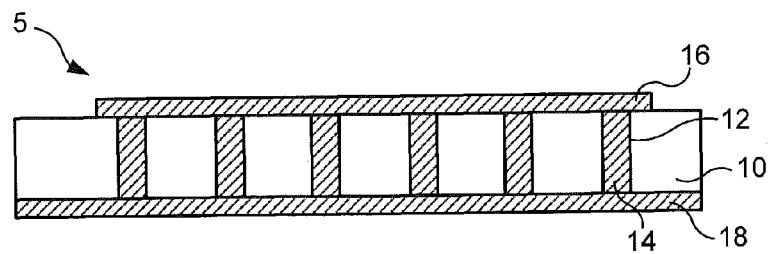
FIG. 1 is a cross-sectional view of a conventional submount for an electronic device.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Thermal management is an important part of package design for many solid state electronic devices, and particularly for solid state light emitting devices. It is desirable to provide a package for solid state light emitting devices that draws heat away from the solid state light emitting device during device operation so that the heat can be dissipated externally, as high operating temperatures can damage or alter the operation of many parts of a packaged solid state light emitting device. For example, the light emission properties, including wavelength and luminous intensity (radiant flux), of a solid state light emitting device can change with temperature. Increased temperature can also lead to degradation in the light emission characteristics of a solid state light emitting device over time. Furthermore, elevated temperatures can adversely affect the optical, mechanical and/or electrical characteristics of other components of a solid state light emitting device, such as a lens incorporated in the package, an optical encapsulant that surrounds, the solid state light emitting device, and/or a luminescent conversion element that converts a portion of light emitted by the device to a different wavelength.

Some attempts have been made to use electrically conductive metal substrates in submounts for solid state light emitting devices, as a metal substrate may have a high thermal conductivity. For example, a submount comprising a metal substrate is illustrated in U.S. Publication No. 2004/0079957, which is assigned to the assignee of the present invention and which is incorporated herein by reference. As shown therein, electrical connections from the bottom of the substrate to the top of the substrate may be made through conductive vias that are insulated from the substrate by an insulating layer. However, metal may not be an ideal material for the substrate of a light emitting device submount, because a relative thick (e.g., tens of micrometers) electrically insulating layer would be needed. Such insulating material is usually some type of polymer material which has a very high thermal resistance. In addition, compared with silicon, as an example, it is more expensive to polish the metal submount surfaces to a desired smoothness. Moreover, silicon wafers are very flat, while it is harder to make metal substrates flat across a very large area.

Accordingly, some embodiments provide a submount for an electronic device including a semiconductor/metal hybrid substrate. A semiconductor/metal hybrid substrate as described herein can exhibit decreased thermal resistance at normal operating temperatures compared to some other types of substrates.

Figure 2:
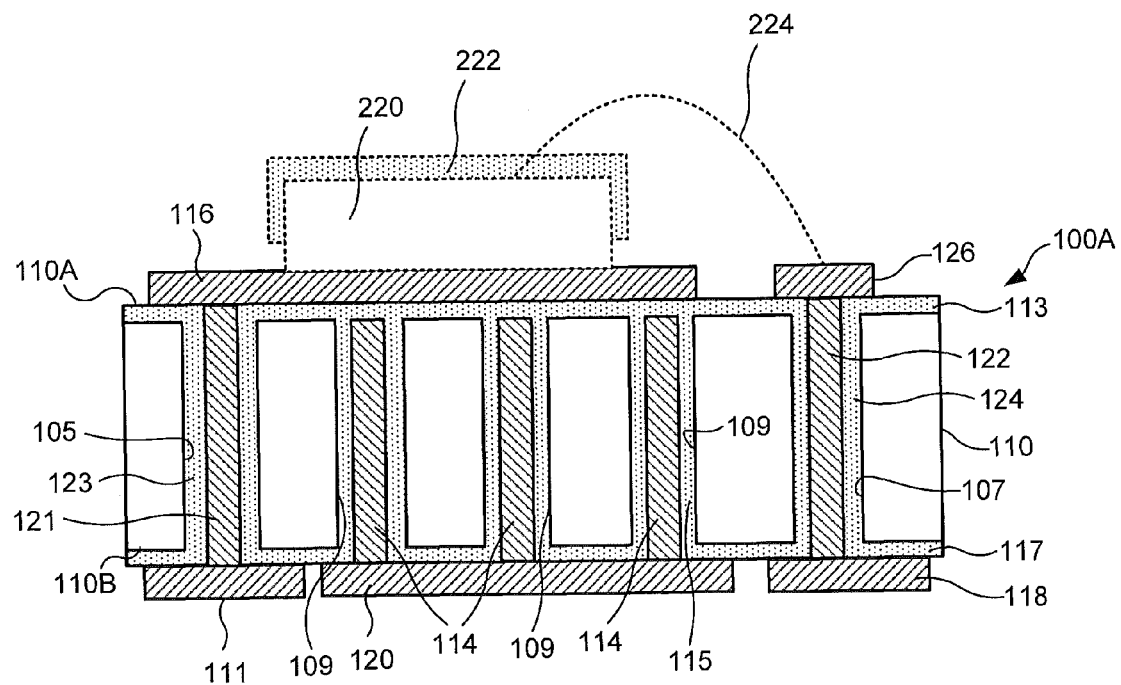
FIGS. 2, 3, 4, 5 and 6 are cross-sectional views of submounts according to some embodiments.

A submount 100A for a high power light emitting device according to some embodiments is illustrated in FIG. 2. As shown therein, the submount 100A includes a thermally and electrically conductive semiconductor substrate 110 having first and second major surfaces 110A, 110B. The semiconductor substrate 110 may comprise silicon in some embodiments. Other possible materials for the substrate 100 include GaAs, SiC, AlN, and/or diamond. Silicon may provide a particularly suitable substrate for the submount 100A, as it may provide a very smooth, flat surface on which to mount an electronic device and to overmold a lens or housing, and silicon wafers of up to 12 inches in diameter can be reliably fabricated and used for production. Having a smooth submount for mounting an LED may result in fewer and/or smaller air gaps being formed between an LED device and a die attach pad on the substrate, and/or between the heatsink contact pad and an external heatsink, which may lower the thermal resistance of the device.

Furthermore, having a smooth substrate surface may permit the formation of electrical traces, such as a die attach pad and/or a heatsink contact pad, that are thinner than could be formed on, for example, a ceramic substrate. Likewise, providing a substrate 100 of a material such as silicon that has a high thermal conductivity may permit the use of a thinner heatsink contact, as less metal may be required to obtain a desired thermal conductivity between the substrate and the heatsink.

Ceramic submount surface smoothness is usually not better than 5 micrometers (5000 nanometers) root mean square (RMS). In contrast, a silicon wafer may have a surface smoothness of less than 10 nanometers RMS. In some embodiments, the substrate 100 may have a smoothness that is about 10 nm RMS or less. In further embodiments, the substrate 100 may have a smoothness that is about 2 nm RMS or less.

Because the substrate 100 may have an extremely smooth surface, the heatsink contact pad and the die attach pad may also be highly smooth. For example, the heatsink contact pad and/or the die attach pad may have a smoothness of about 50 nm RMS. In some cases, the heatsink contact pad and/or the die attach pad may have a smoothness of about 30 nm RMS or less. As is known in the art, smoothness of a device feature may be measured using a profilometer, atomic force microscopy, or other suitable techniques.

Accordingly, in some cases, the heatsink contact pad and/or the die attach pad may even have a thickness of about 10 micrometers or less, and in some cases as low as 2 micrometers, or even 1 micrometer. In contrast, a metal pad formed on a ceramic substrate may have to be at least about 70 micrometers for thermal conduction purposes.

Having a flat submount/panel for mounting multiple LEDs makes lens molding easier and/or may improve consistency of the optical performance of the device. (In many cases, multiple submounts are in a panel form and multiple LEDs are attached to the panel and lens molding happens at panel level.) An 8-inch prime silicon wafer's bow may be less than 30 micrometers. In contrast, the bow for an 8-inch size ceramic substrate may be about 3 mm (3000 micrometers), and the bow for an 8-inch size PCB may be in the order of 150 um.

The substrate 110 provides mechanical support for elements of the package, including electrically conductive elements, such as electrical traces that form a die attach pad 116, a wirebond pad 126, solder contacts 111, 118, and a heatsink contact pad 120. Further, additional traces and connections can be fabricated on the top, side, or bottom of the substrate 110, or layered within the substrate 110. The die attach pad 116, wirebond pad 126, solder contacts 111, 118, and any other connections can be interconnected to each other in any combinations using known methods, for example via holes. The conductive features on the substrate 110 may be made of a conductive material, such as copper, gold, silver, tin, or other metals.

The substrate 110 may further include features, such as semi-cylindrical and quarter-cylindrical spaces, orientation markings, side bond pads, flanges and other features.

A first thin, thermally conductive insulating film 113 may be formed on the first major surface 110A of the semiconductor substrate 110, and a second thin, thermally conductive insulating film 117 may be formed on the second major surface 110B of the semiconductor substrate 110. In some embodiments, the thermally conductive insulating films 113, 117 may include a ceramic/polymer film such as the Thermal Clad film available from by The Bergquist Company of Chanhassen, Minn., USA. The insulating film 113 may be formed by methods, such as, but not limited to, thermal oxidation, chemical vapor deposition, physical chemical deposition and/or spin coat of various insulating materials Commonly used electrically insulating materials (for Si) are silicon nitride and silicon oxide. Other materials such as aluminum nitride, aluminum oxide spin-on-glass can also be used. Polymer materials such as polyimide, BCB and epoxy can be used, although they may be less desirable due to their low thermal conductivity. One way to create an insulating layer in Si vias is to grow thermal oxide, which may be uniform on all Si surfaces and may have high quality.

Conductive elements such as metal traces and/or metal leads may be formed on the insulating films 113, 117, and may be insulated from the semiconductor substrate by the insulating films 113, 117. For example, a die attach pad 116 on the first insulating film 113 may be adapted to receive an electronic device, such as a solid state light emitting device 220, on the first major surface 110A of the substrate 110. A wirebond pad 126 may also be formed on the first major surface 110A of the substrate 110, and may also be insulated from the substrate 110 by the insulating film 113.

Similarly, a metal heatsink contact pad 120 and first and second electrical contact pads 111, 118 may be formed on the second major surface 110B of the semiconductor substrate 110. The metal heatsink contact pad 120 and the first and second electrical contact pads 111, 118 may be electrically insulated from the semiconductor substrate 110 by the insulating film 117 on the second major surface 110B of the semiconductor substrate 110. The heatsink contact pad 120 can be fabricated using material having high heat conductivity, such as gold, silver, tin, or other material including but not limited to precious metals.

An LED chip 220 is mounted on the die attach pad 116. The LED chip 220 may include a layer of luminescent conversion material 222, such as a phosphor. The luminescent conversion material 222 may be deposited on the LED chip 220, for example using a conformal phosphor coating method.

A wirebond connection 224 may electrically connect the LED chip 222 the wirebond pad 126 on the first major surface 110A of the conductive semiconductor substrate 110.

The LED chip 220 may be bonded to the die attach pad 116 for example by means of soldering, thermosonic bonding or thermocompression bonding. Heat generated by the LED chip 220 may be dissipated at least in part through a heatsink bonded to the heatsink contact pad 120. However, since the substrate 110 itself may act as a heatsink, the need for bonding an additional heatsink to the structure may be reduced or eliminated.

In some embodiments, one or more via holes 105, 107, 109 may be formed through the surface insulating film(s) 113, 117 and/or the conductive semiconductor substrate 110. The via holes may be internally coated with an insulating material, such as the ceramic/polymer film. Electrical conductors such as electrically conductive traces may be formed in the vias and may electrically connect conductive elements on the first surface of the substrate to conductive elements on the second surface of the substrate. A submount 100 according to such embodiments may be mounted on a surface such as a printed circuit board without the use of metal leads, which may result in a more mechanically robust package.

Referring to FIG. 2, the first electrical contact pad 111 may be electrically connected to the die attach pad 116 through an electrical conductor 121 that extends in a via hole 105 through the substrate 110 and the first and second insulating films 113, 117. The electrical conductor 121 may include a metal and may be insulated from the conductive semiconductor substrate 110 by an electrically insulating sidewall spacer 123 that is provided on an interior surface of the via hole 105.

Similarly, the second electrical contact pad 118 may be electrically connected to the wirebond pad 126 through an electrical conductor 122 that extends in a via hole 107 through the substrate 110 and the first and second insulating films 113, 117. The electrical conductor 122 may include a metal and may be insulated from the conductive semiconductor substrate 110 by an electrically insulating sidewall spacer 124 that is provided on an interior surface of the via hole 107.

The topology of the metal traces that form the die attach pad 116, the heatsink contact pad 120, the wirebond pad 126 and the electrical contacts 111, 118, may vary widely while still remaining within the scope of the invention.

To increase the vertical thermal conductivity of the submount 110, a plurality of thermally conductive thermal conduction members 114 may be provided in vertical via holes 109 in the substrate 110. The thermal conduction members 114, may extend through the second insulating film 117 and into the conductive semiconductor substrate 110. In some embodiments, as illustrated in FIG. 2, the thermal conduction members 114 may extend completely through the conductive semiconductor substrate 110 to contact the first insulating film 113 on the first major surface 110A of the conductive semiconductor substrate 110. However, the thermal conduction members 114 may be electrically insulated from the die attach pad 116 by the first insulating film 113.

The thermal conduction members 114 may also be insulated from the conductive semiconductor substrate 110 by electrically insulating sidewall spacers 115. The electrically insulating sidewall spacers 15 may include the same insulating material as the first and second surface insulating layers 113, 117. For example, the electrically insulating sidewall spacers 115 may include a thermally conductive ceramic/polymer film such as the Thermal Clad film discussed above. In other embodiments, the electrically insulating sidewall spacers 115 may include a different electrical insulating material, such as silicon oxide or silicon nitride. The electrically insulating sidewall spacers 115 may help to electrically insulate the heatsink contact pad 120 from the conductive semiconductor substrate 110.

The thermal conduction members 114 may help to increase the thermal conductivity of the submount 100A by providing additional thermally conductive pathways to carry heat generated by an LED 220 mounted on the die attach pad 116 to the heatsink contact pad 120 without providing electrical connection between the die attach pad 116 and the heatsink contact pad 120.

Figure 3:
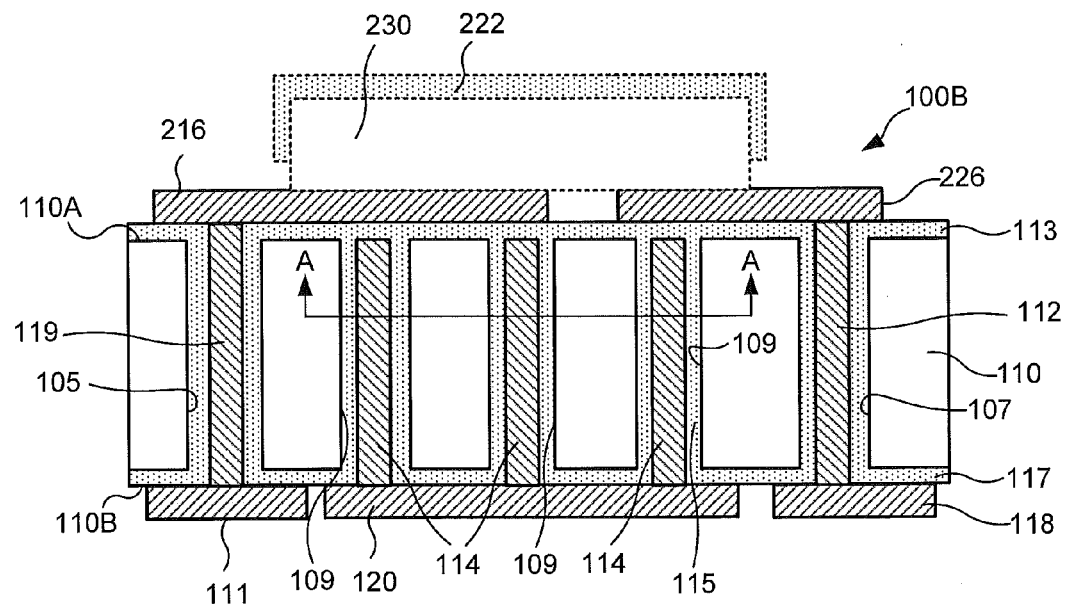

Referring to FIG. 3, a "flip-chip" LED chip 230 may be provided on the submount 100B and may contact a pair of die attach pads 216, 226 on the first surface insulating layer 113.

Figure 4:
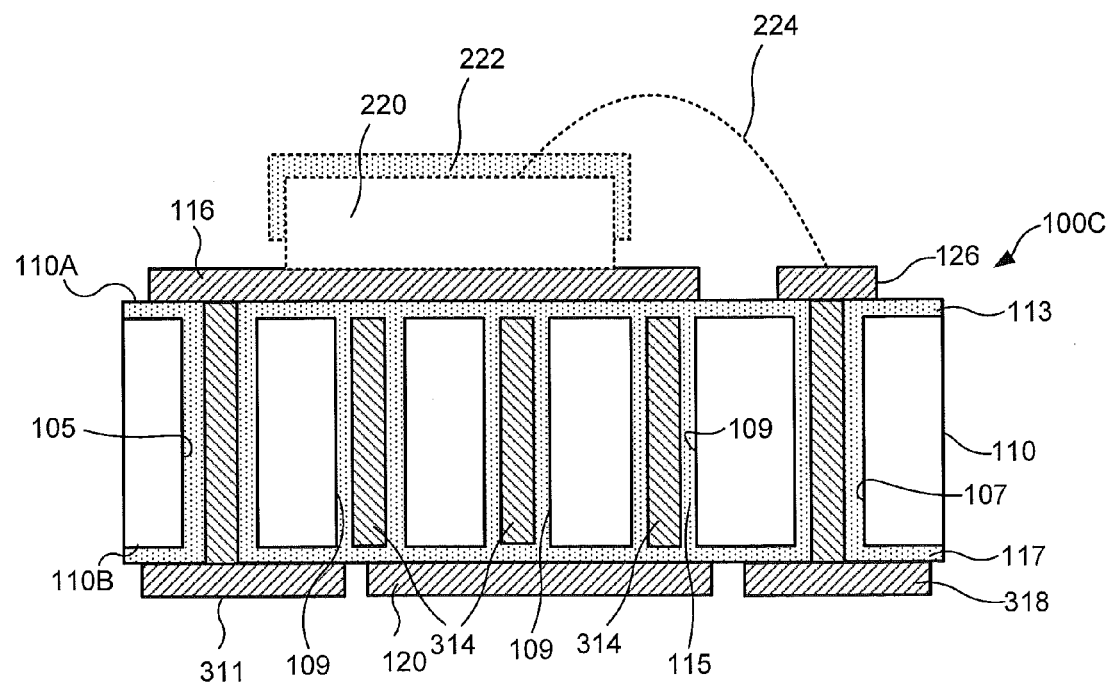

Further embodiments of the invention are illustrated in FIG. 4. As shown therein, a submount 100C according to some embodiments includes a conductive semiconductor substrate 110. A plurality of via holes 109 are formed through the conductive semiconductor substrate 110 between the die attach pad 116 and heatsink contact pad 120. A plurality of thermal conduction members 314 are provided in the respective via holes 109 and extend from the first major surface 110A of the conductive semiconductor substrate 110 to the second major surface 110B of the conductive semiconductor substrate 110. The thermal conduction members 314 are insulated from the conductive semiconductor substrate 110 by electrically insulating sidewall spacers 115. The thermal conduction members 314 are electrically insulated from the die attach pad 116 by the first surface insulating layer 113 and are electrically insulated from the heatsink contact pad 120 by the second surface insulating layer 117. That is, the thermal conduction members 314 may extend through the conductive substrate 110 but not thorough the first surface insulating layer 113 or the second surface insulating layer 117. However, the presence of the thermal conduction members 314 in the conductive semiconductor substrate 110 may increase thermal conductivity and/or decrease thermal resistance for heat generated in the LED 220 to be extracted from the heatsink contact pad 120 on the second major surface of the conductive semiconductor substrate 110.

Figure 5:
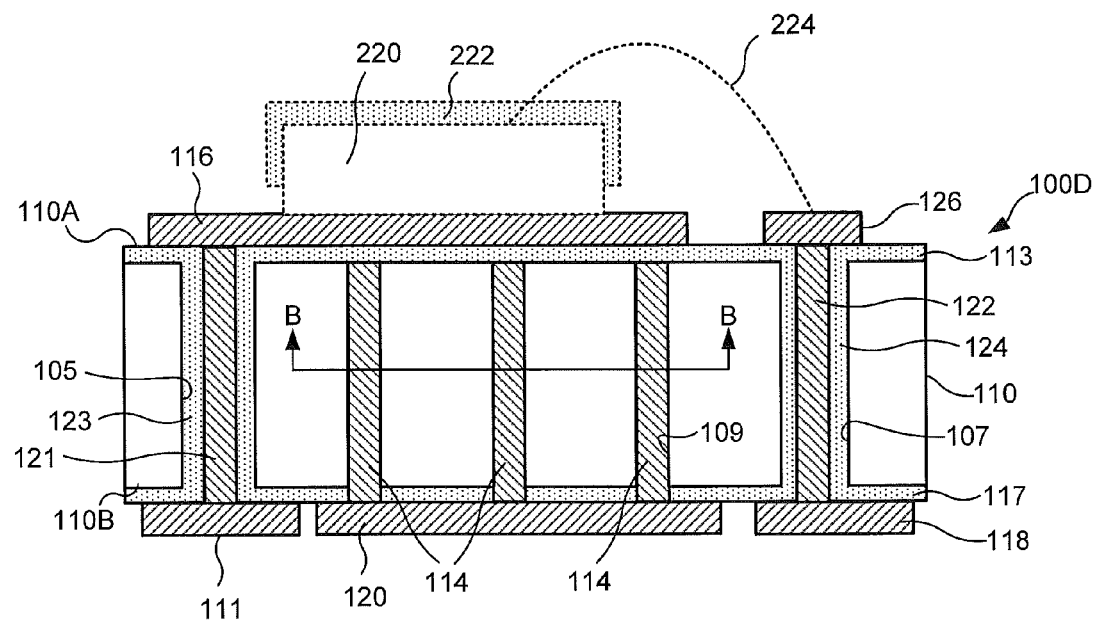

Further embodiment of the invention are illustrated in FIG. 5. As shown therein, a submount 100D includes a conductive semiconductor substrate 110 as described above with respect to FIGS. 2-4. The submount 100D includes a plurality of thermal conduction members 114 that extend from the heatsink contact pad 120 into the conductive semiconductor substrate 110. However in the embodiments of FIG. 5, the conductive thermal conduction members 114 are not electrically insulated from the conductive semiconductor substrate 110. That is, no sidewall insulating members may be provided in the via holes 109, so that the thermal conduction members 114 may be in direct contact with the conductive substrate 110 on the side walls thereof.

Figure 6:
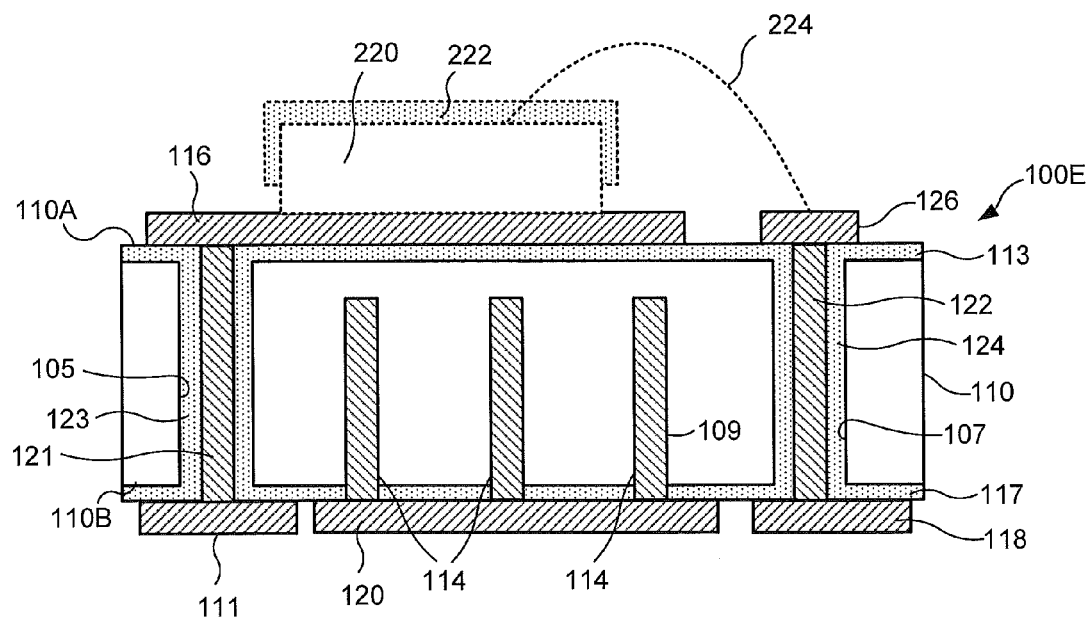

Still further embodiments of the invention are illustrated in FIG. 6. As shown therein, a submount 100E includes a conductive semiconductor substrate 110 as described above with respect to FIGS. 2-5. The submount 100E includes a plurality of thermal conduction members 114 that extend from the heatsink contact pad 120 into the conductive semiconductor substrate 110. As in the embodiments of FIG. 5, the conductive thermal conduction members 114 are not electrically insulated from the conductive semiconductor substrate 110. However, in the embodiments of FIG. 6, the thermal conduction members 114 do not extend completely through the conductive semiconductor substring 110, but remain spaced apart from the first surface insulating layer 113. The via holes 109 may thus be formed using a timed etch, for example.

A submount according to embodiments of the present invention may also include electronic circuitry such as a discrete zener diode and/or a resistor network for electrostatic discharge (ESD) and/or over-voltage protection.

Figure 7A:
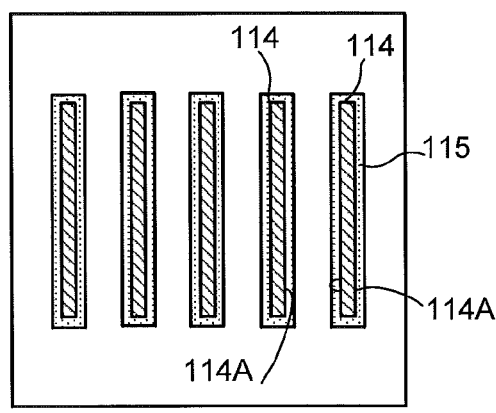
FIGS. 7A to 7D are partial cross sections of submounts according to some embodiments taken along line A-A of FIG. 3.
Figure 7B:
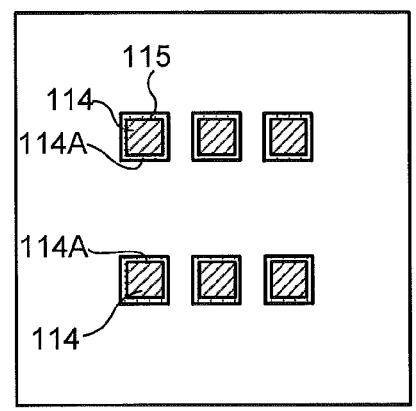
Figure 7C:
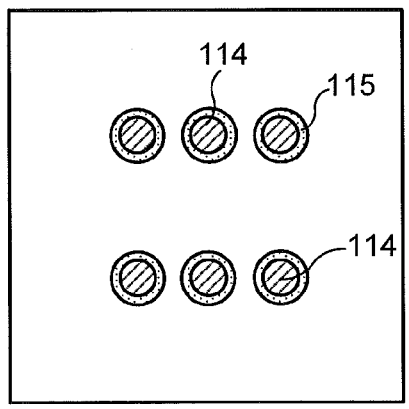
Figure 7D:
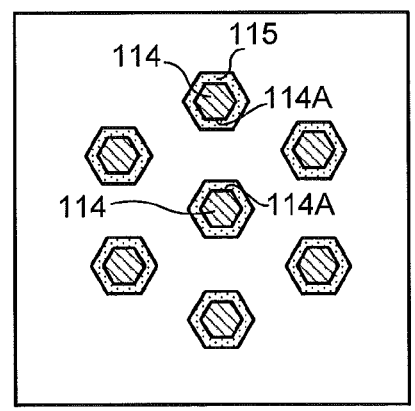
Figure 8A:
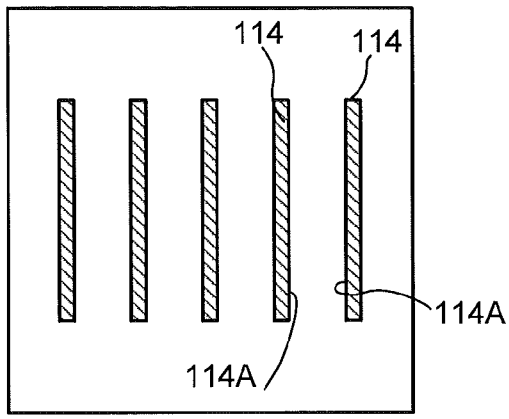
FIGS. 8A to 8D are partial cross sections of submounts according to some embodiments taken along line B-B of FIG. 5.
Figure 8B:
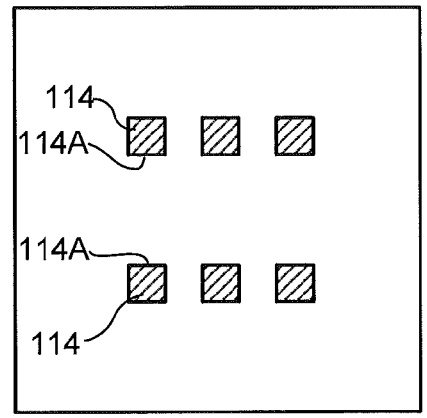
Figure 8C:
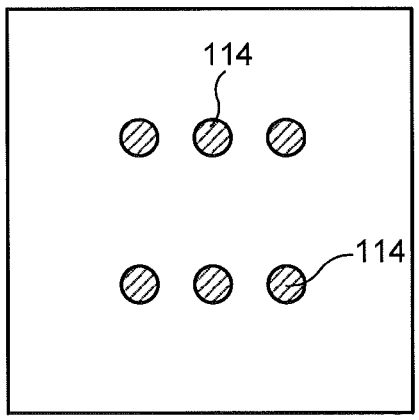
Figure 8D:
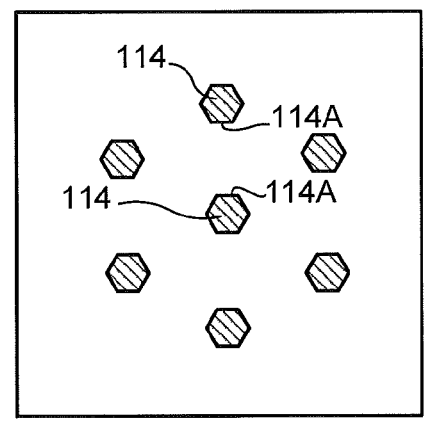

FIGS. 7A through 7D are planar cross-sectional views taken along line A-A of FIG. 3, and FIGS. 8A through 8D are planar cross-sectional views taken along line B-B of FIG. 5. As illustrated in FIGS. 7A and 8A, the thermal conduction members 114 can be formed as elongated trenches in the substrate 110. Forming the thermal conduction members 114 as elongated trenches may increase heat transfer between the thermal conduction members 114, thereby improving heat dissipation from the electronic device 220. For example, heat transfer (i.e., thermal communication, may be enhanced when the thermal conduction members 114 have respective flat surfaces 114A, that face each other in a lateral plane in the substrate 110.

In other embodiments illustrated in FIGS. 7B-7D and 8B-8D, the thermal conduction members 114 can be formed as posts or pillars having square (FIGS. 7B and 8B) circular (FIGS. 7C and 8C), hexagonal (FIGS. 7D and 8D) or other regular or irregular geometric cross-sections.

A submount for a semiconductor device including a semiconductor/metal hybrid substrate may exhibit significantly improved thermal performance relative, for example, to a submount including a ceramic substrate or a ceramic/metal hybrid substrate. As shown, for example, in Table 1 below, the thermal conductivity of a silicon-copper semiconductor/metal hybrid substrate may be significantly lower than the thermal conductivity of an alumina-copper ceramic/metal hybrid substrate at 127° C. operating temperature. Thermal conductivity of the substrate is strongly affected by the fraction of the cross-sectional area of the filled vias. This fraction can be up to 0.5 or 50% of the total submount area.

TABLE 1

| Effective Thermal Conductivity. | | | |
|---|---|---|---|
| Cu Cross-Sectional Area (as fraction of total cross-sectional area) | Substrate Area (as fraction of total) | Effective thermal conductivity (W/m * K) for Si—Cu Hybrid | Effective thermal conductivity (W/m * K) for alumina-Cu Hybrid |
| 0 | 1.0 | 100 | 23 |
| 0.2 | 0.8 | 159 | 97 |
| 0.31 | 0.69 | 192 | 139 |
| 0.4 | 0.6 | 220 | 174 |

Furthermore, the Si—Cu hybrid substrate exhibited a thermal resistance estimated at about 5° C./W at a Cu fraction of 0.2, while the ceramic-Cu hybrid had a thermal resistance estimated at about 6° C./W.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises," "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below," "above," "upper," "lower," "horizontal," "lateral," "vertical," "beneath," "over," "on," etc., may be used herein to describe a relationship of one element, layer or region to another element, layer or region as illustrated in the figures. It will be understood that these terms are intended to encompass different orientations of the device in addition to the orientation depicted in the figures.

Many different embodiments have been disclosed herein, in connection with the above description and the drawings. It will be understood that it would be unduly repetitious and obfuscating to literally describe and illustrate every combination and subcombination of these embodiments. Accordingly, all embodiments can be combined in any way and/or combination, and the present specification, including the drawings, shall be construed to constitute a complete written description of all combinations and subcombinations of the embodiments described herein, and of the manner and process of making and using them, and shall support claims to any such combination or subcombination.

In the drawings and specification, there have been disclosed typical embodiments of the invention and, although specific terms are employed, they are used in a generic and descriptive sense only and not for purposes of limitation, the scope of the invention being set forth in the following claims.

That which is claimed is:

1. A submount for an electronic device, the submount comprising:
    a substrate including first and second major surfaces on opposite sides of the substrate;
    a surface insulating layer on the first major surface of the semiconductor substrate;
    an electrically conductive die attach pad on the surface insulating layer, wherein the electrically conductive die attach pad is electrically insulated from the substrate by the surface insulating layer;
    a heatsink contact pad on the second major surface of the substrate; and
    a thermal conduction member extending from the second major surface of the substrate through the substrate toward the first major surface of the substrate, wherein the thermal conduction member is between the electrically conductive die attach pad and the heatsink contact pad and is electrically insulated from the electrically conductive die attach pad, and wherein the thermal conduction member has a higher thermal conductivity than a thermal conductivity of the substrate.

2. The submount of claim 1, wherein the substrate is electrically conductive, the submount further comprising an electrically insulating sidewall spacer between the thermal conduction member and the substrate, wherein the thermal conduction member is insulated from the substrate by the electrically insulating sidewall spacer.

3. The submount of claim 1, wherein the thermal conduction member is in direct contact with the surface insulating layer and is insulated from the electrically conductive die attach pad by the surface insulating layer.

4. The submount of claim 1, wherein the thermal conduction member is in direct contact with the heatsink contact pad.

5. The submount of claim 1, wherein the thermal conduction member extends at least halfway through the substrate toward the first major surface of the substrate.

6. The submount of claim 1, wherein the surface insulating layer comprises a first surface insulating layer, the submount further comprising:
    a second surface insulating layer on the second major surface of the substrate;
    wherein the second surface insulating layer is between the heatsink contact pad and the substrate.

7. The submount of claim 6, wherein the thermal conduction member extends through the second surface insulating layer to contact the heatsink contact pad.

8. The submount of claim 6, wherein the thermal conduction member is electrically isolated from the heatsink contact pad by the second surface insulating layer.

9. The submount of claim 1, further comprising a plurality of thermal conduction members extending from the second major surface of the substrate toward the first major surface of the substrate.

10. The submount of claim 9, wherein the surface insulating layer comprises a first surface insulating layer, the submount further comprising:
    a second surface insulating layer on the second major surface of the substrate;
    wherein the second surface insulating layer is between the heatsink contact pad and the substrate.

11. The submount of claim 10, wherein the plurality of thermal conduction members extend through the second surface insulating layer to contact the heatsink contact pad.

12. The submount of claim 10, wherein the plurality of thermal conduction members are electrically isolated from the heatsink contact pad by the second surface insulating layer.

13. The submount of claim 1, wherein the substrate has a smoothness of about 10 nm or less.

14. The submount of claim 1, wherein the substrate has a smoothness of about 2 nm or less.

15. The submount of claim 1, wherein the heatsink contact pad and/or the electrically conductive die attach pad has a smoothness of about 50 nm or less.

16. The submount of claim 1, wherein the heatsink contact pad and/or the electrically conductive die attach pad has a smoothness of about 30 nm or less.

17. The submount of claim 1, wherein the heatsink contact pad and/or the electrically conductive die attach pad has a thickness of about 10 micrometers or less.

18. The submount of claim 1, wherein the heatsink contact pad and/or the electrically conductive die attach pad has a thickness of about 2 micrometers or less.

19. The submount of claim 1, wherein the heatsink contact pad and/or the electrically conductive die attach pad has a thickness of about 1 micrometer.

20. The submount of claim 1, wherein the surface insulating layer comprises a first surface insulating layer, the submount further comprising:
    a second surface insulating layer on the second major surface of the substrate;

a contact pad on the second major surface of the substrate, wherein the contact pad is electrically isolated from the substrate by the second surface insulating layer; and an electrically conductive thermal conduction member extending through the substrate, the first surface insulating layer and the second surface insulating layer, wherein the electrically conductive thermal conduction member electrically connects the electrically conductive die attach pad and the contact pad.

21. The submount of claim 20, wherein the electrically conductive thermal conduction member is insulated from the substrate by an electrically insulating sidewall spacer.

22. The submount of claim 20, wherein the electrically conductive thermal conduction member comprises a first electrically conductive thermal conduction member and the contact pad comprises a first contact pad, the submount further comprising:

a bonding pad on the first major surface of the substrate, wherein the bonding pad is electrically insulated from the substrate by the first surface insulating layer;

a second contact pad on the second major surface of the substrate, wherein the second contact pad is electrically isolated from the substrate by the second surface insulating layer; and a second electrically conductive thermal conduction member extending through the substrate, the first surface insulating layer and the second surface insulating layer, wherein the second electrically conductive thermal conduction member electrically connects the bonding pad and the second contact pad.

23. The submount of claim 22, wherein the first electrically conductive thermal conduction member is insulated from the substrate by a first electrically insulating sidewall spacer and the second electrically conductive thermal conduction member is insulated from the substrate by a second electrically insulating sidewall spacer.

24. A light emitting device, comprising:
a submount as recited in claim 1; and
a solid state light emitting device on the submount;
wherein the solid state light emitting device is on the electrically conductive die attach pad.

* * * * *